(12) United States Patent
Lee

(10) Patent No.: US 11,054,466 B2
(45) Date of Patent: Jul. 6, 2021

(54) SEMICONDUCTOR DEVICE TEST SYSTEM AND SEMICONDUCTOR DEVICE TEST METHOD

(71) Applicant: SAMSUNG ELECTRONICS CO., LTD., Suwon-si (KR)

(72) Inventor: Sung-Gu Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 506 days.

(21) Appl. No.: 15/994,367

(22) Filed: May 31, 2018

(65) Prior Publication Data

US 2019/0162779 A1     May 30, 2019

(30) Foreign Application Priority Data

Nov. 29, 2017 (KR) .................. 10-2017-0161620

(51) Int. Cl.
| | |
|---|---|
| *G01R 31/30* | (2006.01) |
| *G01R 31/28* | (2006.01) |
| *G06F 1/26* | (2006.01) |
| *G11C 29/56* | (2006.01) |
| *G01R 31/317* | (2006.01) |
| *G11C 29/50* | (2006.01) |

(52) U.S. Cl.
CPC ......... *G01R 31/3004* (2013.01); *G01R 31/28* (2013.01); *G01R 31/2882* (2013.01); *G01R 31/30* (2013.01); *G01R 31/31721* (2013.01); *G06F 1/26* (2013.01); *G11C 29/56* (2013.01); *G11C 2029/5006* (2013.01); *G11C 2029/5602* (2013.01)

(58) Field of Classification Search
CPC ............ G01R 31/3004; G01R 31/2834; G01R 31/2882; G01R 31/31721; G01R 31/31924; G01R 31/2879; G01R 19/00; G01R 31/30; G01R 31/28; G06F 1/26; G11C 29/56; G11C 2029/5006; G11C 2029/5602

See application file for complete search history.

(56) References Cited

U.S. PATENT DOCUMENTS

| | | |
|---|---|---|
| 6,756,807 B2 | 6/2004 | Johnson et al. |
| 7,714,603 B2 | 5/2010 | Eldridge et al. |
| 8,217,671 B2 | 7/2012 | Agarwal et al. |
| 9,513,333 B2 | 12/2016 | Song et al. |
| 9,638,718 B2 | 5/2017 | Haefner et al. |
| 2004/0066690 A1* | 4/2004 | Perner .................. G11C 29/50 365/209 |
| 2007/0153597 A1* | 7/2007 | Chang .................. G11C 29/50 365/201 |
| 2017/0023633 A1 | 1/2017 | Song |

FOREIGN PATENT DOCUMENTS

KR     10-1306283 B1     9/2013

* cited by examiner

*Primary Examiner* — Amy He
(74) *Attorney, Agent, or Firm* — Sughrue Mion, PLLC

(57) ABSTRACT

A semiconductor device test system and a semiconductor device test method are provided. The system includes a device under test (DUT) which provides an output voltage to a load connected to an output terminal, automatic test equipment (ATE) which supplies power to the DUT and measures the output voltage of the DUT, and a current mirror which is connected between the ATE and the DUT. The ATE outputs a reference current to the current mirror, and the DUT provides an output current to the current mirror. The output current is obtained by mirroring the reference current from the ATE.

20 Claims, 17 Drawing Sheets

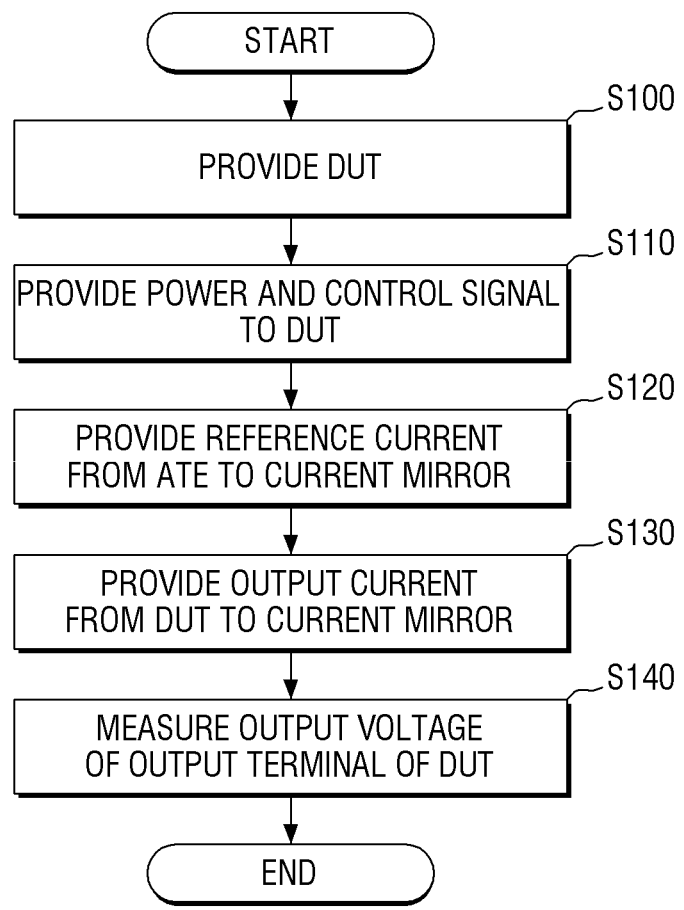

SEMICONDUCTOR DEVICE TEST SYSTEM AND SEMICONDUCTOR DEVICE TEST METHOD

This application claims priority from Korean Patent Application No. 10-2017-0161620, filed on Nov. 29, 2017, in the Korean Intellectual Property Office, the disclosure of which is incorporated by reference herein in its entirety.

BACKGROUND

1. Field

Systems and methods consistent with the present disclosure relate to a semiconductor device test system and a semiconductor device test method.

2. Description of the Related Art

A semiconductor device manufactured through a manufacturing process undergoes a test process to determine whether the semiconductor device operates normally. This test process is automatically performed by automatic test equipment (ATE). The ATE provides power and a control signal to a device under test (DUT) and measures a voltage or current output from the DUT to determine whether the DUT has passed the test.

SUMMARY

It is an aspect to provide a semiconductor device test system capable of providing an environment in which a device under test (DUT) outputs a current.

It is an aspect to also provide a semiconductor device test method capable of providing an environment in which a DUT outputs a current.

However, the aspects are not restricted to the aspects set forth herein. The above and other aspects will become more apparent to one of ordinary skill in the art by referencing the detailed description given below.

According to an aspect of an exemplary embodiment, there is provided a semiconductor device test system including a device under test (DUT) which provides an output voltage to a load connected to an output terminal, automatic test equipment (ATE) which supplies power to the DUT and measures the output voltage of the DUT, and a current mirror which is connected between the ATE and the DUT, wherein the ATE outputs a reference current to the current mirror, and the DUT provides an output current to the current mirror, the output current being obtained by mirroring the reference current from the ATE to the current mirror.

According to another aspect of an exemplary embodiment, there is provided a semiconductor device test system including a substrate, a current mirror which is mounted on the substrate to be electrically connected to an automatic test equipment (ATE) and receives a reference current from the ATE; and a device under test (DUT) which is mounted on the substrate and configured to be electrically connected to the current mirror and provides an output current to the current mirror, the output current being obtained by mirroring the reference current to the current mirror from the ATE.

According to another aspect of an exemplary embodiment, there is provided a semiconductor device test system including a current mirror which comprises an input terminal and an output terminal, and automatic test equipment (ATE) which provides a reference current to the current mirror and measures an output voltage of a DUT outputting that outputs a current obtained by mirroring the reference current using the current mirror.

According to another aspect of an exemplary embodiment, there is provided a semiconductor device test method including electrically connecting a current mirror and a device under test (DUT) which are connected to automatic test equipment (ATE); providing a power supply voltage from the ATE to the DUT, providing a reference current from the ATE to the current mirror, providing an output current, which is obtained by mirroring the reference current using the current mirror, from the DUT to the current mirror, and measuring an output voltage of an output terminal of the DUT using the ATE.

According to another aspect of an exemplary embodiment, there is provided a semiconductor device manufacturing method including connecting a device under test (DUT) to a current mirror connected to automatic test equipment (ATE) by mounting the DUT on a test board; electrically connecting the current mirror and the DUT which are connected to the ATE; providing a power supply voltage from the ATE to the DUT; providing a reference current from the ATE to the current mirror; providing an output current, which is obtained by mirroring the reference current using the current mirror, from an output terminal of the DUT to the current mirror; measuring an output voltage of the output terminal of the DUT using the ATE; and determining whether the DUT has passed an output voltage test based on the output voltage.

BRIEF DESCRIPTION OF THE DRAWINGS

These and/or other aspects will become apparent and more readily appreciated from the following description of various exemplary embodiments, taken in conjunction with the accompanying drawings in which:

FIG. 4 is a flowchart illustrating a semiconductor device test method according to exemplary embodiments;

DETAILED DESCRIPTION

Figure 1:
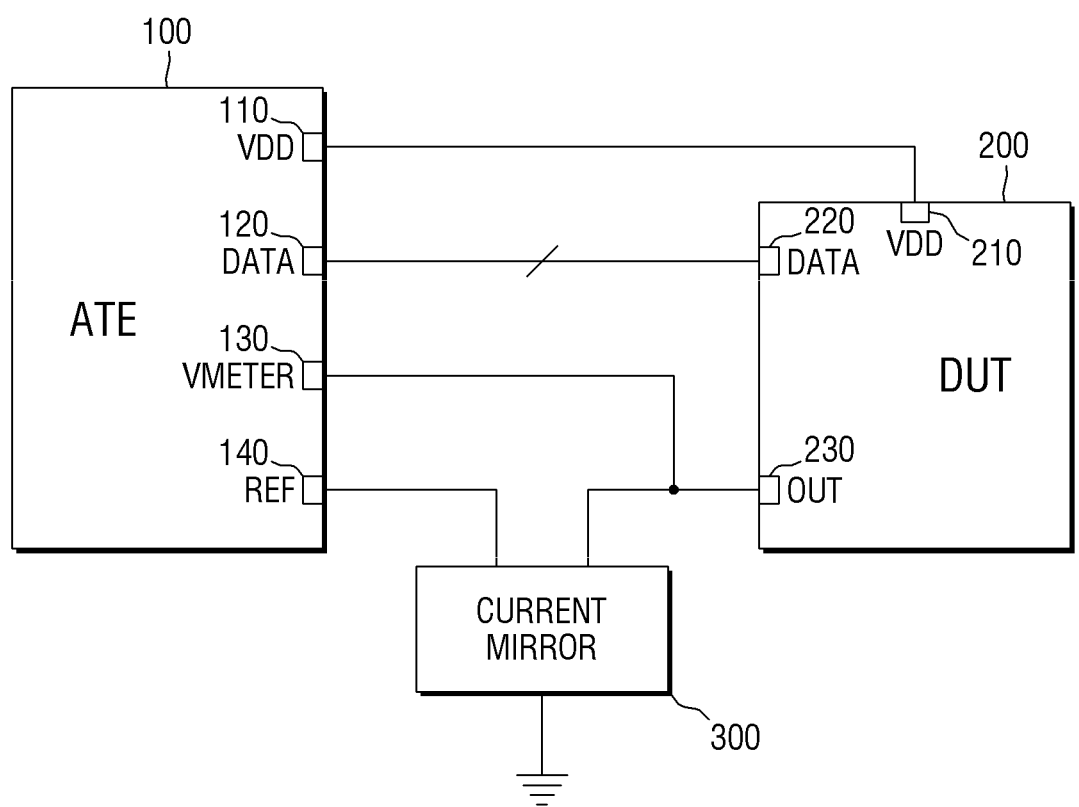
FIG. 1 is a block diagram of a semiconductor device test system according to exemplary embodiments.

FIG. 1 is a block diagram of a semiconductor device test system according to exemplary embodiments.

Referring to FIG. 1, the semiconductor device test system may include automatic test equipment (ATE) 100, a device under test (DUT) 200, and a current mirror 300.

The ATE 100 may automatically test the DUT 200. The ATE 100 may be configured as, for example, a microprocessor-based system.

The ATE 100 may be electrically connected to the DUT 200 and the current mirror 300. The ATE 100 may input a test pattern to the DUT 200 and determine whether there is an error in the DUT 200 based on the output of the DUT 200.

The ATE 100 may include a power output terminal (VDD) 110, a data input/output terminal (DATA) 120, a voltage measurement terminal (VMETER) 130 and a reference current output terminal (REF) 140. The power output terminal 110 may be electrically connected to a power input terminal 210 of the DUT 200, and the ATE 100 may apply a power supply voltage VDD to the power input terminal 210 of the DUT 200 through the power output terminal 110.

The ATE 100 may include the data input/output terminal 120. The data input/output terminal 120 may be electrically connected to a data input/output terminal (DATA) 220 of the DUT 200. The ATE 100 may provide a control signal to the data input/output terminal 220 of the DUT 200 through the data input/output terminal 120. Examples of the control signal provided by the ATE 100 may include, but are not limited to, an enable signal, a clock signal, and a test signal. The control signal may be a digital signal.

The ATE 100 may include the voltage measurement terminal 130. The voltage measurement terminal 130 may be electrically connected to an output terminal (OUT) 230 of the DUT 200. The ATE 100 may measure an output voltage of the output terminal 230 of the DUT 200 through the voltage measurement terminal 130. As will be described later, the ATE 100 may determine whether the DUT 200 operates normally by measuring the output voltage of the DUT 200 while the DUT 200 is outputting an output current IOUT through the output terminal 230.

The ATE 100 may include the reference current output terminal 140. The reference current output terminal 140 may be electrically connected to the current mirror 300. The ATE 100 may provide a reference current to the current mirror 300 through the reference current output terminal 140.

Figure 2:
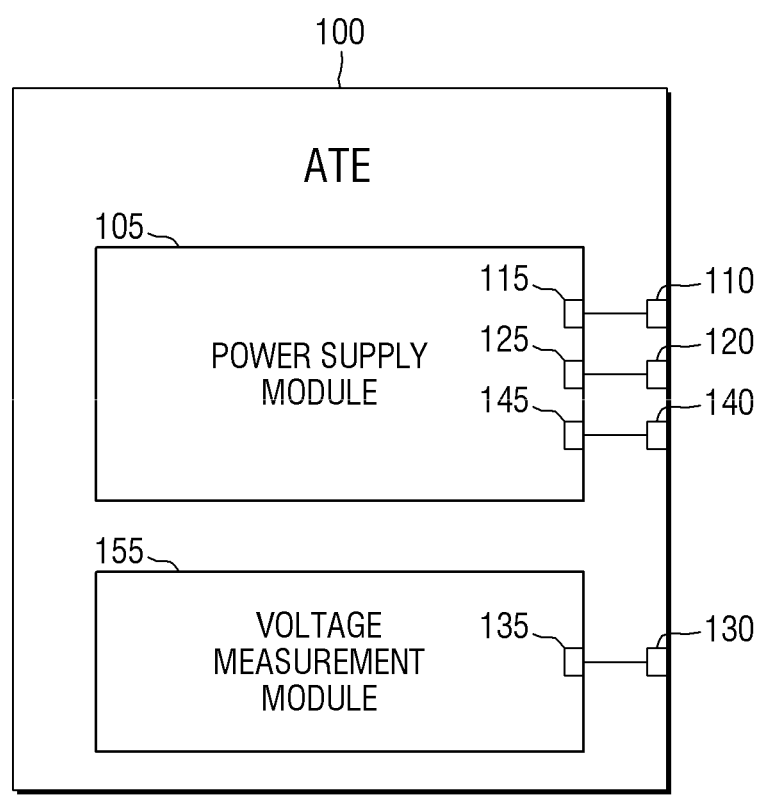
FIG. 2 is a block diagram of automatic test equipment (ATE) of the semiconductor device test system of FIG. 1.

Referring to FIG. 2, the ATE 100 may include a power supply module 105 and a voltage measurement module 155.

The power supply module 105 may supply power to the outside of the ATE 100. Specifically, the power supply module 105 may be connected to the power output terminal 110 of the ATE 100 to supply power to the DUT 200. The power supply module 105 may include a first pad 115, a second pad 125, and a third pad 145. The first through third pads 115, 125 and 145 may be electrically connected to the power output terminal 110, the data input/output terminal 120, and the reference current output terminal 140 of the ATE, respectively.

The voltage measurement module 155 may measure the output voltage of the DUT 200. The voltage measurement module 155 may be electrically connected to the voltage measurement terminal 130 of the ATE 100 through a fourth pad 135. The voltage measurement module 155 may measure the output voltage transmitted to the fourth pad 350 from the output terminal 230 of the DUT 200.

Although not specifically described herein, the ATE 100 may perform a direct current (DC) test for testing whether the DUT 200 and DC parameters of the output voltage of the DUT 200 are suitable for the digital operation of the circuit included on the DUT and an alternating current (AC) margin test related to the transmission delay time, setup time, hold time, etc. of a signal output from the output terminal 230.

In addition, although not specifically illustrated, the ATE 100 may be electrically connected to the DUT 200 through other terminals.

In the semiconductor device test system according to the exemplary embodiments, the ATE 100 a terminal for receiving a current directly from the DUT 200 may be omitted. Therefore, the ATE 100 does not receive an output current directly from the DUT 200. As will be described later, the ATE 100 may provide the reference current to the current mirror 300, and the DUT 200 may receive a load due to the output current obtained by mirroring the reference current using the current mirror 300, not the ATE 100.

The DUT 200 is an object whose operating characteristics are tested by the ATE 100. In some exemplary embodiments, the DUT 200 may be a power management integrated circuit (PMIC).

In other exemplary embodiments, the DUT 200 may be a volatile memory device such as a static read access memory (SRAM), a dynamic static read access memory (DRAM) or a synchronous static read access memory (SDRAM), a nonvolatile memory device such as a read only memory (ROM), a programmable read only memory (PROM), an erasable PROM (EPROM), an electrically erasable PROM (EEPROM), a flash memory, a phase-change RAM (PRAM), a magnetoresistive RAM (MRAM), a resistive random-access memory (RRAM) or a ferroelectric RAM (FRAM), or a memory component including the above memories.

Alternatively, the DUT 200 is not limited to a memory device or a memory package and may also be a non-memory device such as a central processing unit (CPU), a graphic processing unit (GPU), an application processor (AP), or a field programmable gate array (FPGA). That is, the DUT 200 is not particularly limited.

In the description that follows, it is assumed that the DUT 200 is a PMIC.

The DUT 200 may receive power from the ATE 100 and provide an output current to the current mirror 300.

The DUT 200 may include the power input terminal (VDD) 210 which is connected to the power output terminal 110 of the ATE 100 to receive the power supply voltage VDD.

The DUT 200 may include the data input/output terminal (DATA) 220 which receives a control signal from the data input/output terminal 120 of the ATE 100. The DUT 200 may provide a response signal for the control signal to the data input/output terminal 120 of the ATE 100 through the data input/output terminal 220. The response signal may be, for example, a status signal indicating the operating status of the DUT 200.

The DUT 200 may include the output terminal (OUT) 230. The DUT 200 may provide an output current to the current mirror 300 through the output terminal 230. The output current of the DUT 200 may be a mirrored current of the reference current provided to the current mirror 300 by the ATE 100. Therefore, the magnitude of the output current of the DUT 200 may vary depending on the magnitude of the reference current provided by the ATE 100.

The current mirror 300 may be connected to both the ATE 100 and the DUT 200. The current mirror 300 may receive a current, which is obtained by mirroring the reference current provided by the ATE 100, from the DUT 200 in the form of an output current of the DUT 200. An exemplary configuration of the current mirror 300 will now be described with reference to FIGS. 3A and 3B.

Figure 3A:
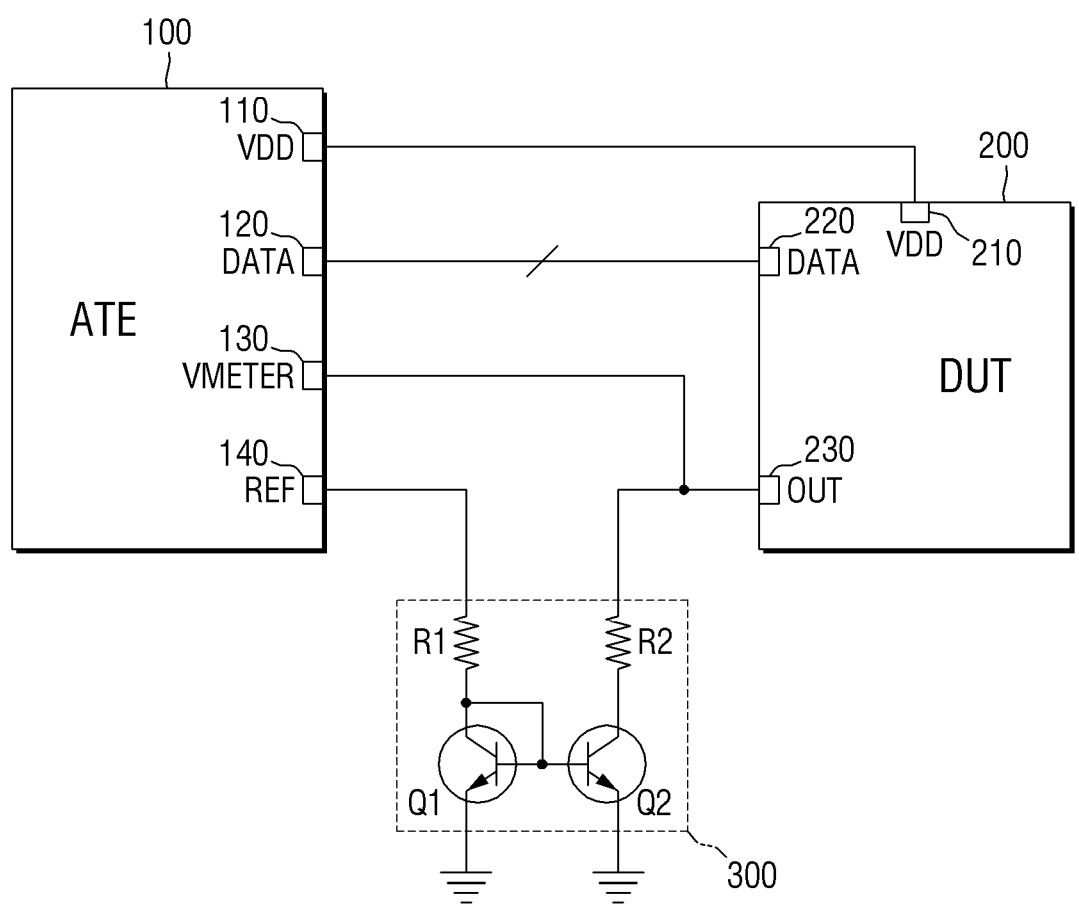
FIGS. 3A through 3C are circuit diagrams of a current mirror of the semiconductor device test system of FIG. 1 according to various exemplary embodiments.
Figure 3B:
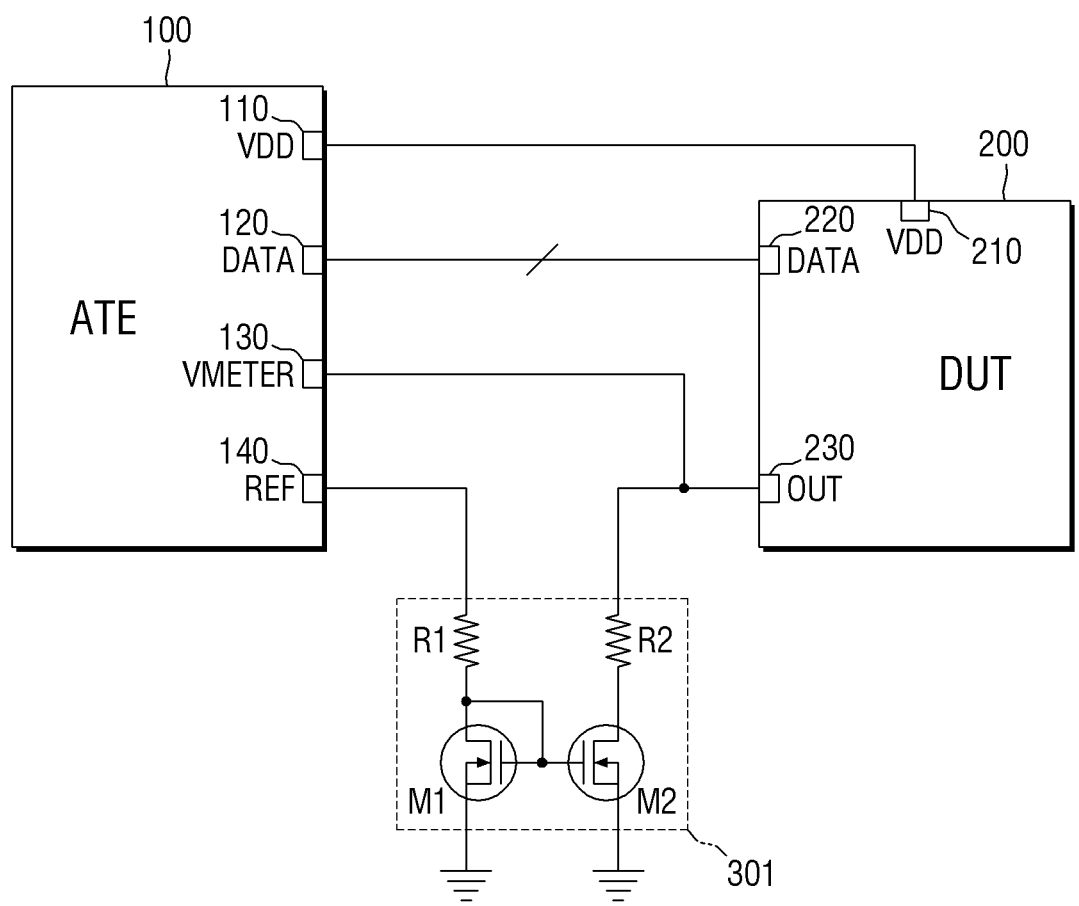
Figure 3C:
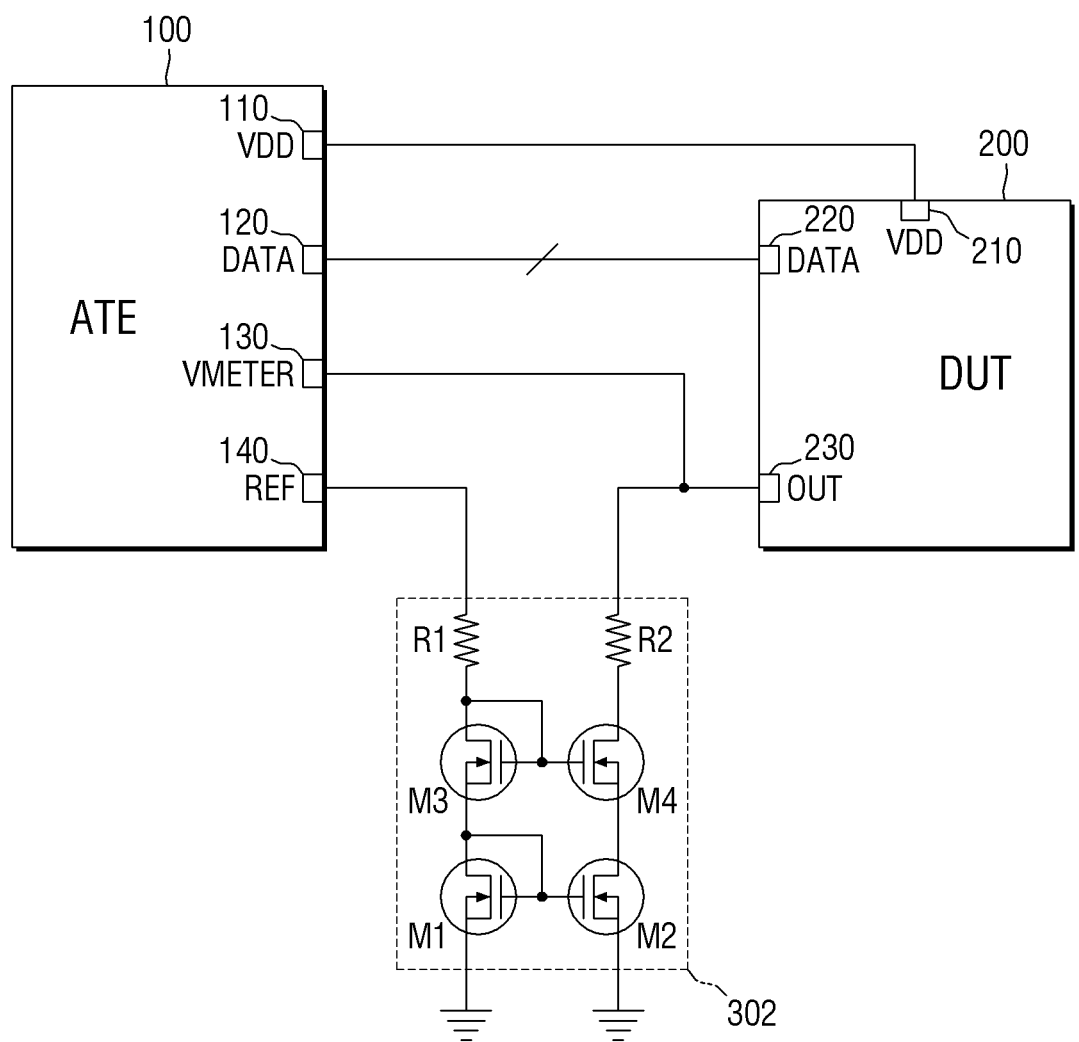

FIGS. 3A through 3C are circuit diagrams illustrating exemplary configurations of the current mirror 300 of FIG. 1.

Referring first to FIG. 3A, a current mirror 300 may include a first transistor Q1, a second transistor Q2, a first resistor R1, and a second resistor R2.

The first transistor Q1 and the second transistor Q2 may be bipolar junction transistors (BJTs). In addition, the first transistor Q1 and the second transistor Q2 may be negative-positive-negative (NPN) transistors, as illustrated in FIG. 3A. However, the first transistor Q1 and the second transistor Q2 are not limited to NPN transistors and, in some exemplary embodiments, may also be positive-negative-positive (PNP) transistors.

A base terminal of the first transistor Q1 may be connected to a collector terminal of the first transistor Q1 and a base terminal of the second transistor Q2. The collector terminal of the first transistor Q1 may also be connected to the first resistor R1. That is, the first resistor R1 may be connected between the collector terminal of the first transistor Q1 and the reference current output terminal 140 of the ATE 100, as shown in FIG. 3A.

An emitter terminal of the first transistor Q1 may be connected to a ground voltage. The reference current provided by the ATE 100 may flow into the collector terminal of the first transistor Q1 and flow out of the emitter terminal of the first transistor Q1.

A collector terminal of the second transistor Q2 may be connected to the second resistor R2. That is, the second resistor R1 may be connected between the collector terminal of the first transistor Q1 and the output terminal 230 of the DUT 200, as shown in FIG. 3A. The emitter terminal of the second transistor Q2 may be connected to a ground voltage. The output current of the DUT 200 may flow into the collector terminal of the second transistor Q2 and flow out of an emitter terminal of the second transistor Q2.

Referring to FIG. 3B, a current mirror 301 may include different elements from the above-described exemplary embodiment of FIG. 3A. Specifically, the current mirror 301 may include a first transistor M1 and a second transistor M2 which are metal oxide semiconductor field effect transistors (MOSFETs).

The current mirror 301 may be similar to the current mirror 300 described above with reference to FIG. 3A, except that the first transistor M1 and the second transistor M2 are MOSFETs. A gate terminal of the first transistor M1 may be electrically connected to a gate terminal of the second transistor M2 and a drain terminal of the first transistor M1. The drain terminal of the first transistor M1 may be electrically connected to the reference current output terminal 140 of the ATE 100 via a first resistor R1.

A drain terminal of the second transistor M2 may be electrically connected to the output terminal 230 of the DUT 200 via a second resistor R2.

A source terminal of the first transistor M1 may be connected to a ground voltage. The reference current flowing into the drain terminal of the first transistor M1 may flow out of the source terminal of the first transistor M1.

A source terminal of the second transistor M2 may be connected to the ground voltage, and the output current of the DUT 200 flowing into the drain terminal of the second transistor M2 may flow out of the source terminal of the second transistor M2.

Referring to FIG. 3C, a current mirror 302 may include different elements from the above-described exemplary embodiments of FIGS. 3A and 3B. Specifically, the current mirror 302 may include first through fourth transistors M1 through M4 connected in a cascode current mirror configuration.

Specifically, the current mirror 302 may include the third transistor M3 and the fourth transistor M4 in addition to the first transistor M1 and the second transistor M2 of the current mirror 301 illustrated in FIG. 3B.

Unlike in FIG. 3C, in some exemplary embodiments, the current mirror 302 may include more transistors. That is, the current mirror 302 may include more transistors connected in a cascode current mirror configuration than the number of transistors shown in FIG. 3C.

In addition, in some exemplary embodiments, the current mirror 302 may include the BJTs of FIG. 3A connected in a cascode current mirror configuration. That is, in some exemplary embodiments, the current mirror 302 may include four or more BJT transistors arranged in a manner consistent with that shown in FIG. 3C.

FIG. 4 is a flowchart illustrating a semiconductor device test method according to exemplary embodiments.

Referring to FIG. 4, the semiconductor device test method according to the exemplary embodiments may include providing a DUT 200 (operation S100), providing power and a control signal from ATE 100 to the DUT 200 (operation S110), providing a reference current from the ATE 100 to a current mirror 300 (operation S120), providing an output current from the DUT 200 to the current mirror 300 (operation S130), and measuring an output voltage of an output terminal of the DUT 200 (operation S140).

The semiconductor device test method according to exemplary embodiments will be described with reference to FIGS. 5 through 7.

Figure 5:
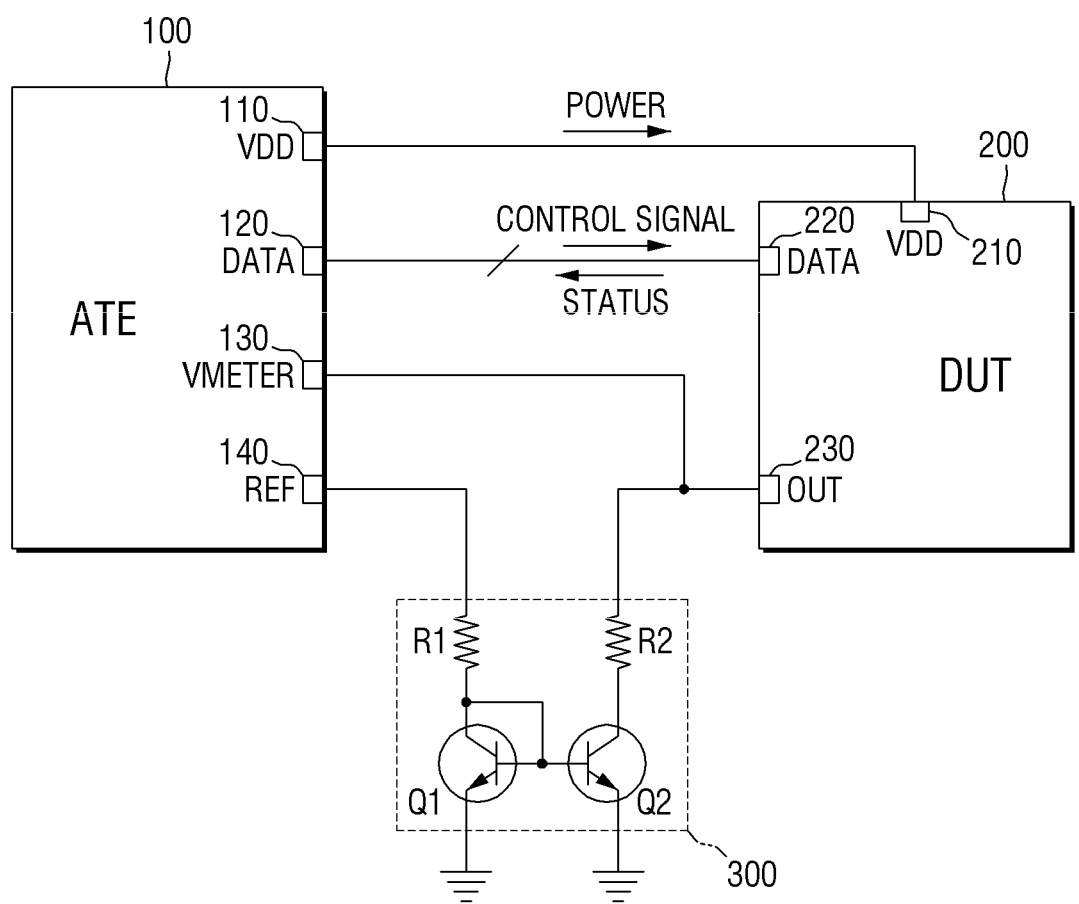
FIG. 5 is a circuit diagram illustrating operation of a semiconductor device test system according to exemplary embodiments.

FIG. 5 is a circuit diagram illustrating the operation of a semiconductor device test system according to exemplary embodiments.

A DUT 200 is provided (operation S100) and connected to an ATE 100 and a current mirror 300.

The DUT 200 may be mounted on, e.g., a test board which is a part of the semiconductor device test system according to the exemplary embodiments. The DUT 200 may be, but is not limited to, a semiconductor device which has circuit elements formed through a semiconductor device manufacturing process and has been packaged through a packaging process. Alternatively, the DUT 200 may be a semiconductor die separated from a wafer through a dicing process before a packaging process is completed.

When the DUT 200 is mounted on the test board described above, a plurality of pins formed on the test board may be electrically connected to terminals 210, 220 and 230 of the DUT 200. The terminals 210, 220 and 230 may be in various forms such as balls, pads, leads, or pins depending on the form of the DUT 200.

Next, power (POWER) and a control signal (CONTROL SIGNAL) are provided from the ATE 100 to the DUT 200 (operation S110).

The ATE 100 may input power to the power input terminal 210 of the DUT 200. Specifically, a power supply module 105 of the ATE 100 may apply a power supply voltage VDD to the DUT 200.

In addition, the power supply module 105 may transmit a control signal to the data input/output terminal 220 of the DUT 200. The control signal may be a digital signal such as an enable signal, a clock signal, or a test signal.

The DUT 200 receiving the control signal may provide a response signal for the control signal to the ATE 100. The response signal may be, for example, a status signal (STATUS) indicating the status of the DUT 200. The ATE 100 may provide a reference current to the current mirror 140 after identifying whether the response signal (STATUS) has been received from the DUT 200.

Figure 6:
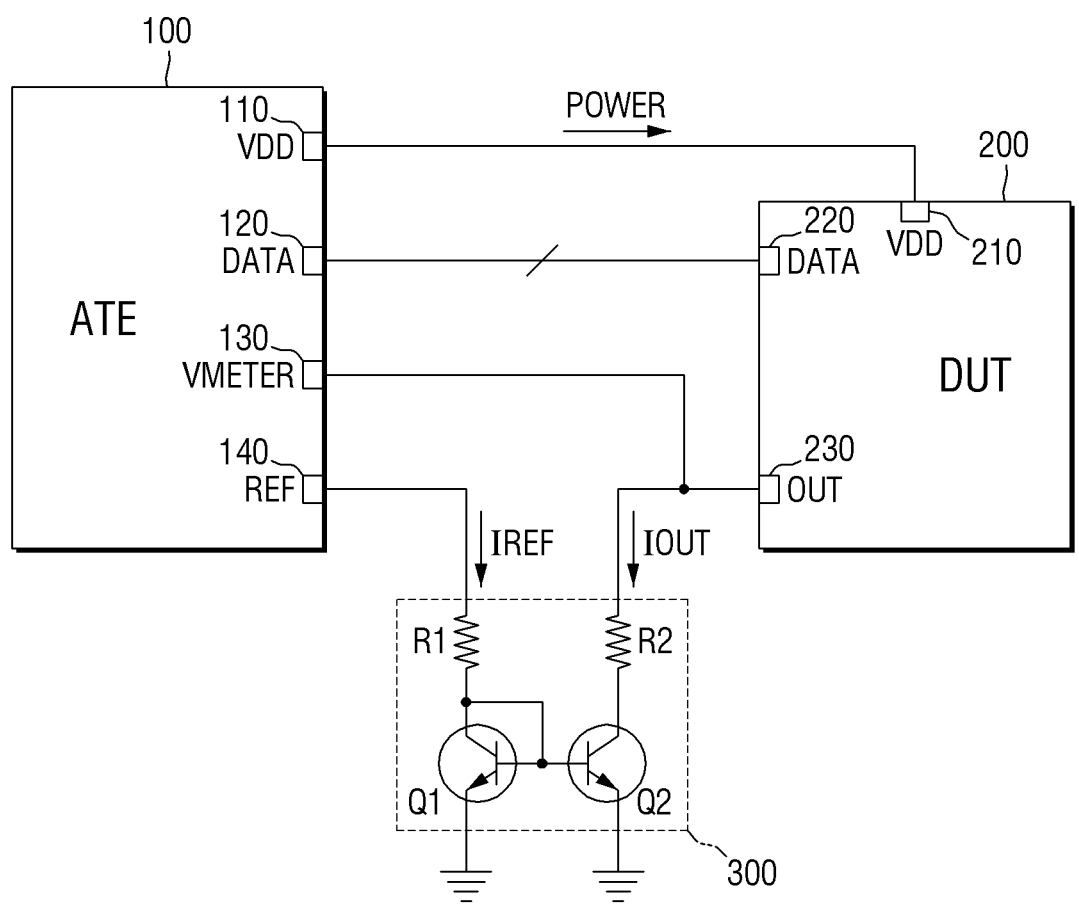
FIG. 6 is a circuit diagram illustrating the operation of the semiconductor device test system according to exemplary embodiments.

FIG. 6 is a circuit diagram illustrating the operation of the semiconductor device test system according to the exemplary embodiments.

Referring to FIG. 6, the ATE 100 may provide a reference current IREF to the current mirror 300 (operation S120). The power supply module 105 may output the reference current IREF through a reference current output terminal 140 of the ATE 100. The output reference current IREF may be provided to a collector terminal of a first transistor Q1 via a first resistor R1.

The reference current IREF may be, but is not limited to, a constant current having a constant magnitude.

The current mirror 300 may mirror the reference current IREF (operation S130). The mirrored reference current IREF may be output from the DUT 200 in the form of an output current IOUT and provided to a collector terminal of a second transistor Q2 of the current mirror 300.

That is, in the semiconductor device test system according to the exemplary embodiments, the ATE 100 and the DUT 200 do not supply currents to each other. Instead, the ATE 100 and the DUT 200 output respective currents to the current mirror 300.

In some exemplary embodiments, the magnitude of the reference current IREF and the magnitude of the output current IOUT may be equal to each other.

In addition, when the reference current IREF is a constant current, the output current IOUT may be a constant current having a constant magnitude.

Figure 7:
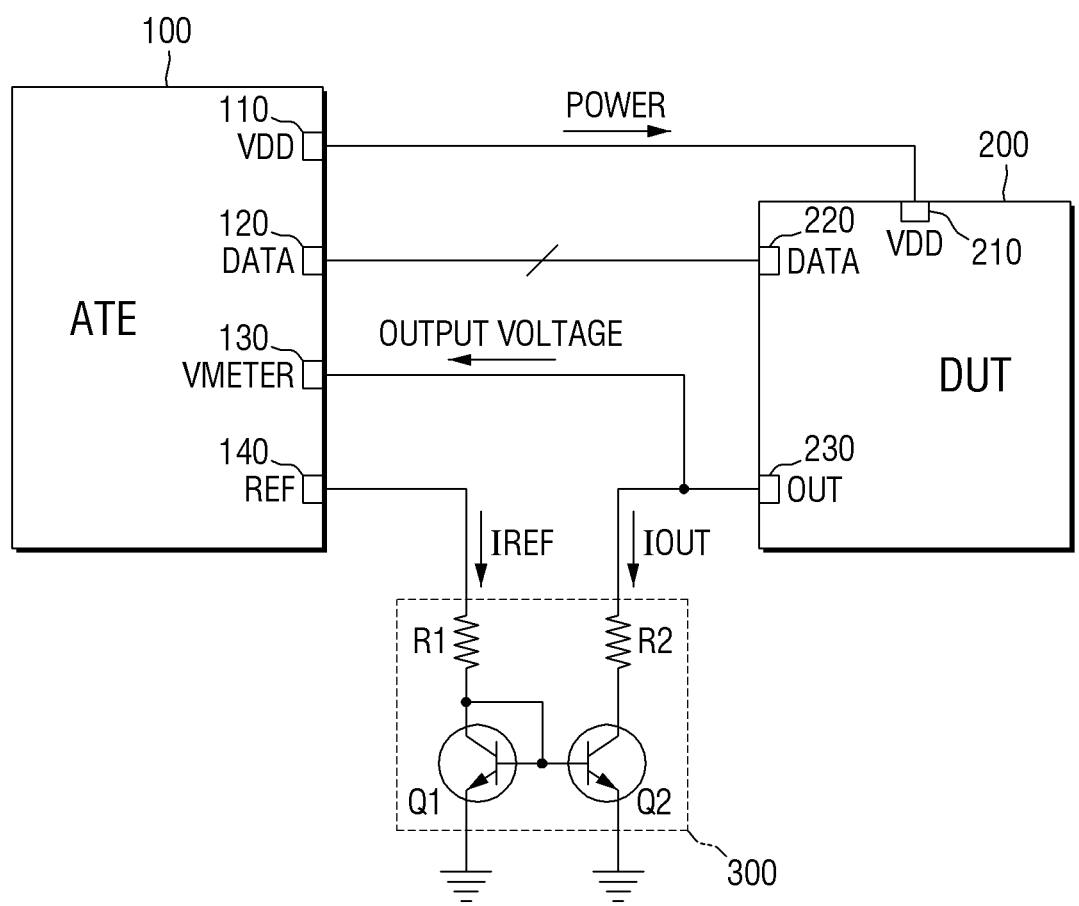
FIG. 7 is a circuit diagram illustrating the operation of the semiconductor device test system according to exemplary embodiments.

FIG. 7 is a circuit diagram illustrating the operation of the semiconductor device test system according to the exemplary embodiments.

Referring to FIG. 7, the ATE 100 measures a voltage output (OUTPUT VOLTAGE) from the output terminal 230 of the DUT 200 (operation S140). The ATE 100 may measure the voltage output from the output terminal 230 when a load is applied to the DUT 200.

The ATE 100 may measure, for example, the magnitude, change, and/or duration of the output voltage of the DUT 200. The output voltage of the DUT 200 may be measured by a voltage measurement module 155 of the ATE 100.

In some exemplary embodiments, the output current IOUT of the DUT 200 may not flow into a voltage measurement terminal 130 of the ATE 100. Therefore, most of the output current IOUT of the DUT 200 may flow to the current mirror 300.

As described above, the semiconductor device test system according to the exemplary embodiments includes the current mirror 300 connected between the ATE 100 and the DUT 200. The current mirror 300 may receive, from the DUT 200, the output current IOUT obtained by mirroring the reference current IREF provided by the ATE 100.

Therefore, the ATE 100 may omit a terminal for receiving the output current IOUT directly from the DUT 200. Even without receiving the output current IOUT directly from the DUT 200, the ATE 100 is able to measure the output voltage applied to the output terminal 230 of the DUT 200 when the DUT 200 outputs the output current IOUT. In other words, when the current mirror 300 receives the output current IOUT of the DUT 200, the effect that occurs when the ATE 100 receives the output current IOUT directly from the DUT 200 may be obtained.

Figure 8:
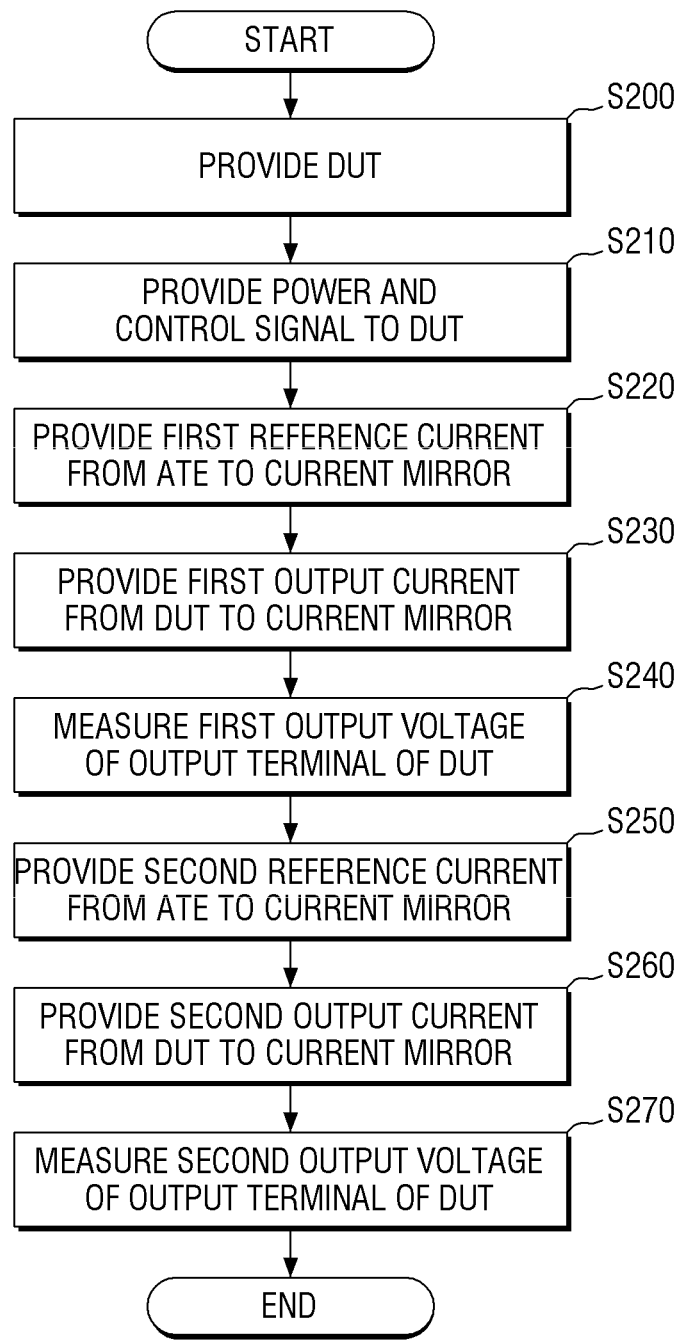
FIG. 8 is a flowchart illustrating a semiconductor device test method according to exemplary embodiments.

FIG. 8 is a flowchart illustrating a semiconductor device test method according to exemplary embodiments.

Referring to FIG. 8, the semiconductor device test method according to the exemplary embodiments may include providing a DUT 200 (operation S200), providing power and a control signal from ATE 100 to the DUT 200 (operation S210), providing a first reference current from the ATE 100 to a current mirror 300 (operation S220), providing a first output current from the DUT 200 to the current mirror 300 (operation S230), measuring a first output voltage of an output terminal of the DUT 200 (operation S240), providing a second reference current from the ATE 100 to the DUT 200 (operation S250), providing a second output current from the DUT 200 to the current mirror 300 (operation S260), and measuring a second output voltage of the output terminal of the DUT 200 (operation S270).

Hereinafter, a description of elements and features identical to those of the semiconductor device test method described above with reference to FIG. 4 will be omitted, and the following description will focus mainly on differences.

Figure 9:
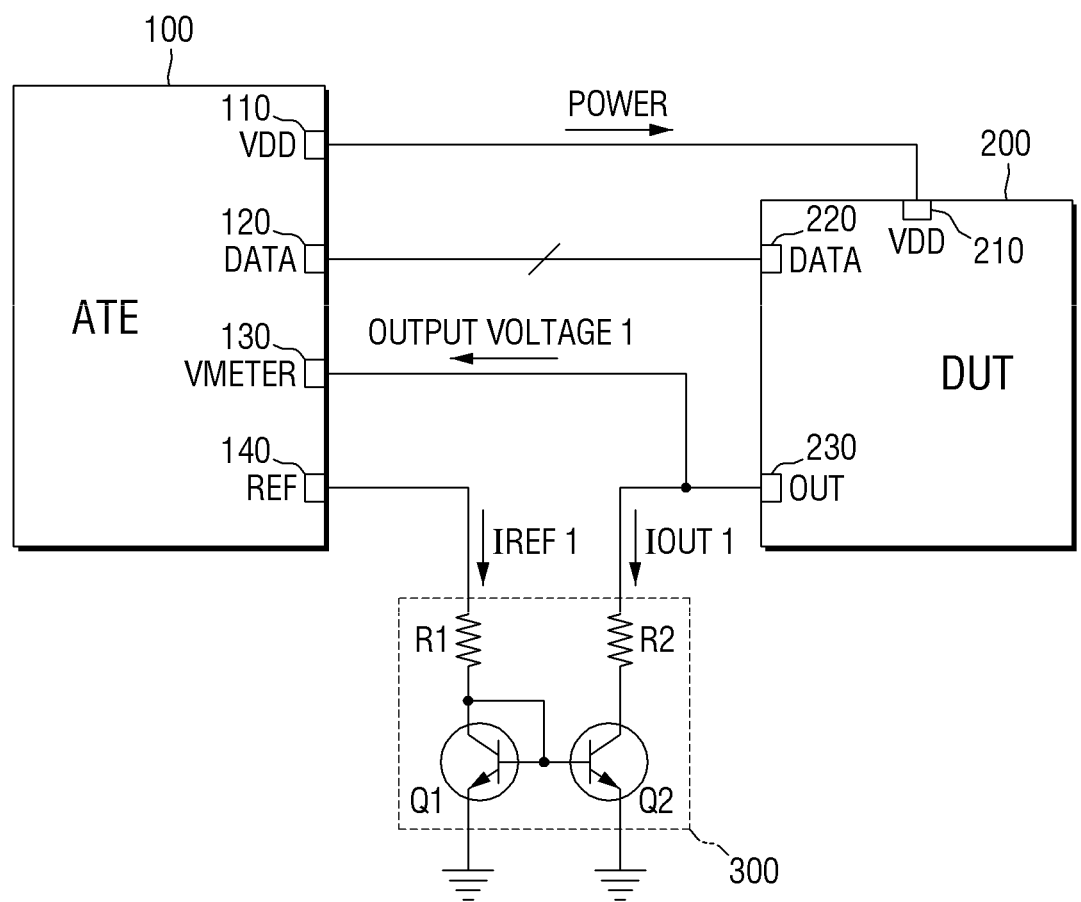
FIG. 9 is a circuit diagram illustrating operation of a semiconductor device test system according to exemplary embodiments.

FIG. 9 is a circuit diagram illustrating the operation of a semiconductor device test system according to exemplary embodiments.

Referring to FIG. 9, ATE 100 provides a first reference current IREF1 to a current mirror 300 (operation S220). The first reference current IREF1 may be, for example, a constant current having a constant magnitude and a current having a magnitude of a first level.

The first reference current IREF1 provided by the ATE 100 may be provided to a collector terminal of a first transistor Q1 via a first resistor R1.

A first output current IOUT1 obtained by mirroring the first reference current IREF1 provided by the ATE 100 is provided from a DUT 200 to the current mirror 300 (operation S230).

When the first reference current IREF1 is a constant current, the first output current IOUT1 may be a constant current having a constant magnitude.

The first output current IOUT1 provided by the DUT 200 may be provided to a collector terminal of a second transistor Q2 via a second resistor R2.

A voltage measurement module 155 of the ATE 100 measures a first output voltage (OUTPUT VOLTAGE 1) of an output terminal 230 while the DUT 200 is outputting the first output current IOUT1 (operation S240). The voltage measurement module 155 may store the first output voltage (OUTPUT VOLTAGE 1) in an internal memory.

Figure 10:
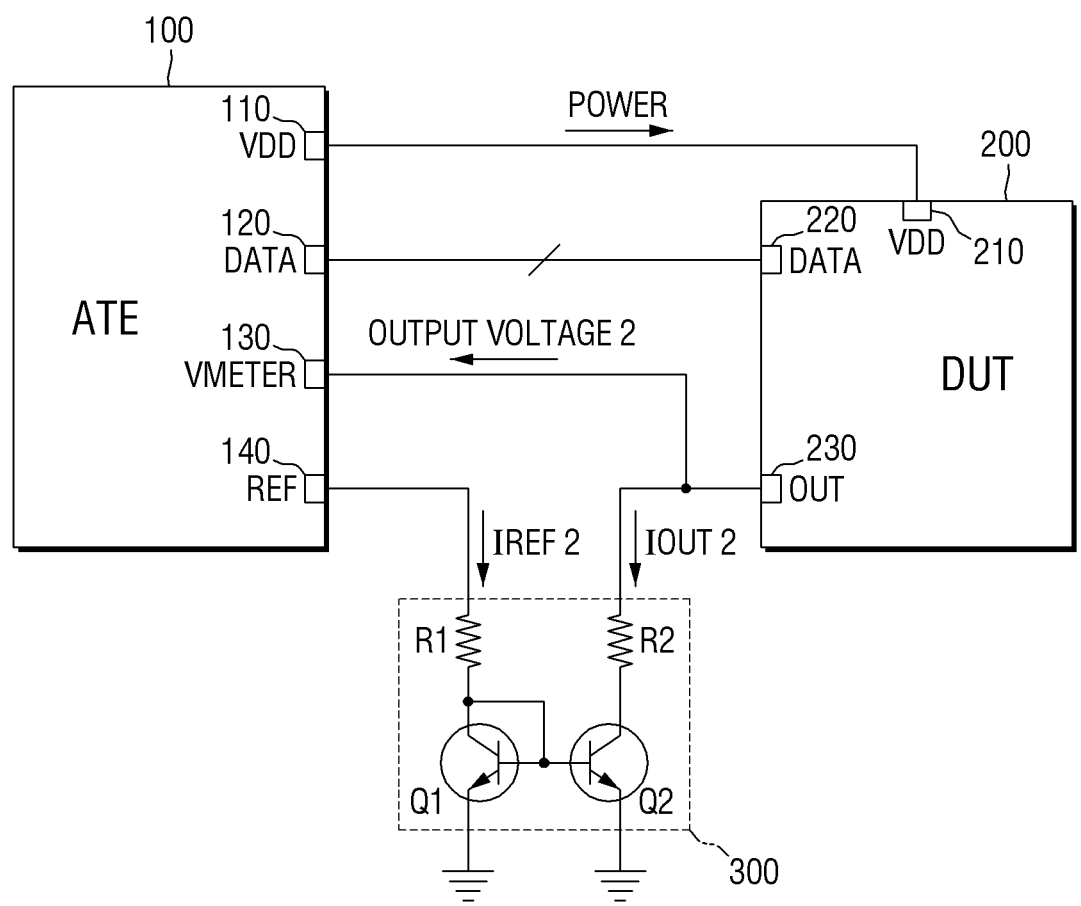
FIG. 10 is a circuit diagram illustrating the operation of the semiconductor device test system according to the exemplary embodiments.

FIG. 10 is a circuit diagram illustrating the operation of the semiconductor device test system according to the exemplary embodiments.

Referring to FIG. 10, continuing from FIG. 9, the ATE 100 provides a second reference current IREF2 to the current mirror 300 (operation S250). The second reference current IREF2 may be different in magnitude from the first reference current IREF1.

A second output current IOUT2 obtained by mirroring the second reference current IREF2 provided by the ATE 100 is provided from the DUT 200 to the current mirror 300 (operation S260).

When the second reference current IREF2 and the first reference current IREF1 are different in magnitude from each other, the second output current IOUT2 and the first output current IOUT1 may also be different in magnitude. In addition, each of the second reference current IREF2 and the second output current IOUT2 may be a constant current having a constant magnitude.

The voltage measurement module 155 of the ATE 100 measures a second output voltage (OUTPUT VOLTAGE 2) of the output terminal 230 while the DUT 200 is outputting the second output current IOUT2 (operation S270). Generally, the DUT 200 needs to provide a constant output voltage regardless of the magnitude of the load required by a device connected to the DUT 200. The voltage measurement module 155 may compare the measured second output voltage (OUTPUT VOLTAGE 2) with the first output voltage (OUTPUT VOLTAGE 1) stored in the internal memory and check whether the DUT 200 provides a constant output voltage.

In the semiconductor device test method according to the exemplary embodiments, the ATE 100 may also measure whether the output voltage of the DUT 200 changes. That is, when the internal setting of the DUT 200 is changed in a state where the magnitude of a reference current IREF provided to the current mirror 300 by the ATE 100 is constant, the ATE 100 may measure whether the output voltage is changed according to the change in the internal setting of the DUT 200.

The internal setting may be changed by, e.g., a control signal provided by the ATE 100. Therefore, while providing the reference current IREF having a constant magnitude to the current mirror 300, the ATE 100 may change the internal setting of the DUT 200 using the control signal and measure a change in the output voltage of the output terminal 230 of the DUT 200 according to the change in the internal setting.

Figure 11:
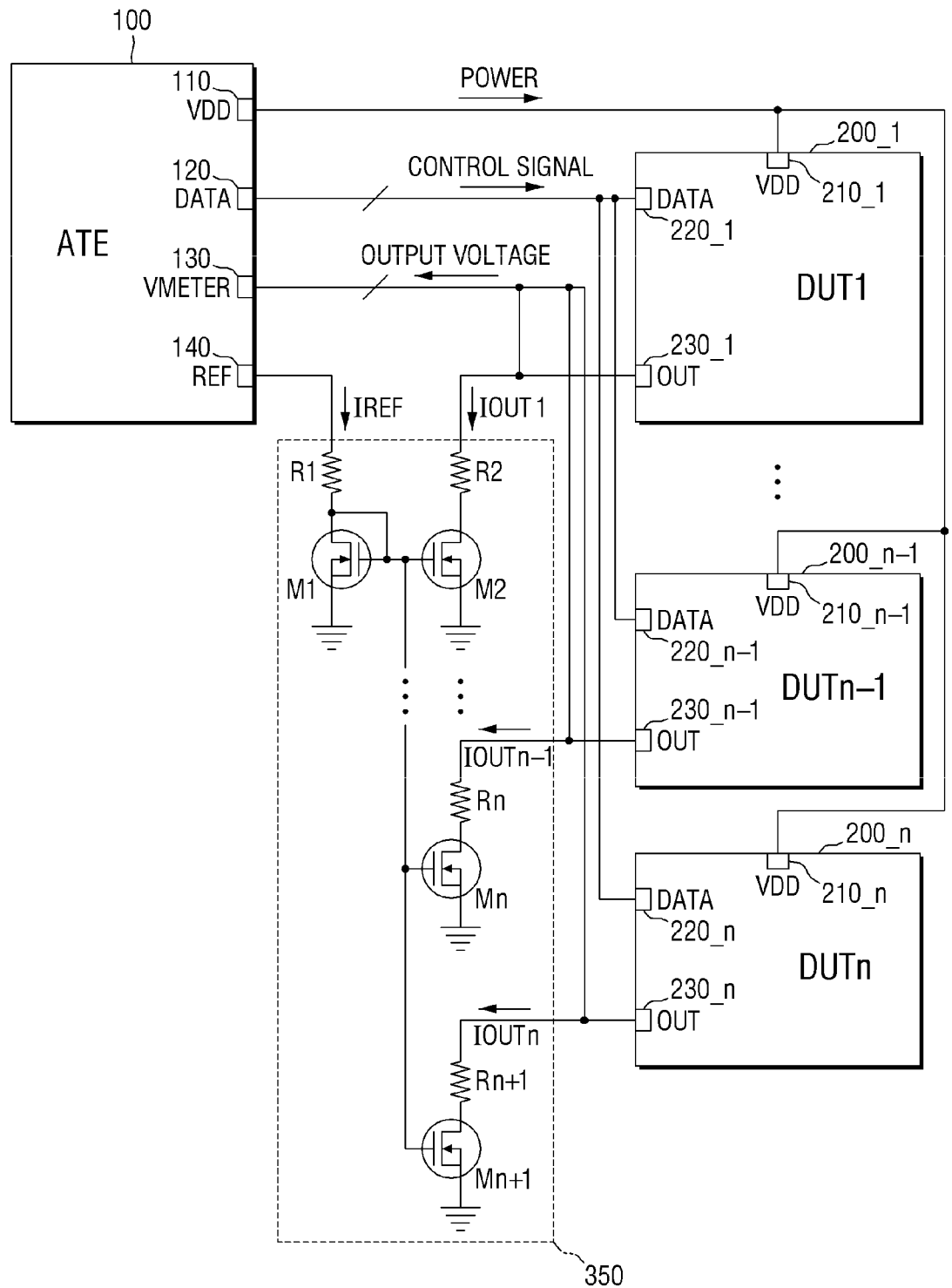
FIG. 11 is a circuit diagram of a semiconductor device test system according to exemplary embodiments.

FIG. 11 is a circuit diagram of a semiconductor device test system according to exemplary embodiments.

The semiconductor device test system according to the exemplary embodiments may include first through $n^{th}$ DUTs 200_1 through 200_$n$ connected to one ATE 100 and one current mirror 350.

The first through $n^{th}$ DUTs 200_1 through 200_$n$ may be identical devices. That is, the semiconductor device test system illustrated in FIG. 11 may be an apparatus for testing a plurality of identical DUTs.

The first through $n^{th}$ DUTs 200_1 through 200_$n$ may respectively include power input terminals (VDD) 210_1 through 210_$n$ connected to the ATE 100. The first through $n^{th}$ DUTs 200_1 through 200_$n$ may receive power supply voltages VDD from the ATE 100 through the power input terminals 210_1 through 210_$n$, respectively. When the first through $n^{th}$ DUTs 200_1 through 200_$n$ are identical devices as described above, the power supply voltages VDD received from the ATE 100 by the first through $n^{th}$ DUTs 200_1 through 200_$n$ through the power input terminals 210_1 through 210_$n$ may be the same.

The first through $n^{th}$ DUTs 200_1 to 200_$n$ may respectively include data input/output terminals (DATA) 220_1 through 220_$n$ connected to the ATE 100. The first through $n^{th}$ DUTs 200_1 through 200_$n$ may receive control signals (CONTROL SIGNAL) from the power input terminals 210_1 through 210_$n$ through the data input/output terminals 220_1 through 220_$n$. When the first through $n^{th}$ DUTs 200_1 through 200_$n$ are identical devices as described above, the control signals received from the ATE 100 by the first through $n^{th}$ DUTs 200_1 through 200_$n$ through the data input/output terminals 210_1 through 210_$n$ may be the same.

The first through $n^{th}$ DUTs 200_1 through 200_$n$ may include output terminals (OUT) 230_1 through 230_$n$ for outputting output currents, respectively. If second through $(n+1)^{th}$ transistors M2 through Mn+1 and second through $(n+1)^{th}$ resistors R2 through Rn+1 included in the current mirror 350 are identical in configuration, the magnitudes of output currents IOUT1 through IOUTn output from the first through $n^{th}$ DUTs 200_1 through 200_$n$ may be equal to each other.

The current mirror 350 may include first through $(n+1)^{th}$ transistors M1 through Mn+1. The first transistor M1 may be connected to a reference current output terminal 140 of the ATE 100. The second through $(n+1)^{th}$ transistors M2 through Mn+1 may be connected to the first through $n^{th}$ DUTs 200_1 through 200_$n$, respectively.

In addition, respective gate terminals of the second through the $(n+1)^{th}$ transistors M2 through Mn+1 may be connected to each other. That is, the second through $(n+1)^{th}$ transistors M2 through Mn+1 may share a gate voltage.

The ATE 100 may provide a reference current IREF to the current mirror 350. The current mirror 350 may mirror the reference current IREF to generate the first through the $n^{th}$ output currents IOUT1 through IOUTn. That is, the first through $n^{th}$ DUTs 200_1 through 200_$n$ may provide the first through $n^{th}$ output currents IOUT1 through IOUTn to the current mirror 350 in response to the reference current IREF provided by the ATE 100.

The ATE 100 may measure output voltages (OUTPUT VOLTAGE) of the output terminals 230_1 through 230_$n$ of the first through $n^{th}$ DUTs 200_1 through 200_$n$ through respective voltage measurement terminals 130. The ATE 100 may provide the reference current IREF to the current mirror 350 and measure the output voltages of the output terminals 230_1 through 230_$n$ of the first through $n^{th}$ DUTs 200_1 through 200_$n$ while the first through $n^{th}$ DUTs 200_1 through 200_$n$ are outputting the first through $n^{th}$ output currents IOUT1 through IOUTn obtained by mirroring the reference current IREF using the current mirror 350. In some exemplary embodiments, a current mirror with two transistors may be used (such as shown in FIGS. 3A-3C) and the output terminals 230_1 to 230_$n$ may be switched in order to measure the output voltage using a single voltage measurement terminal 130 of the ATE 100.

Figure 12:
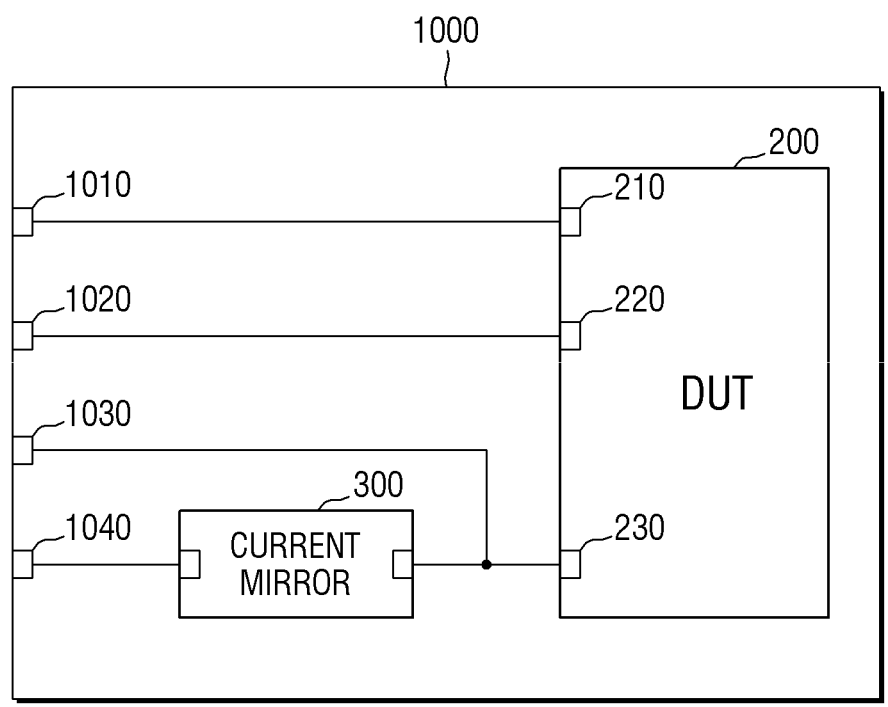
FIG. 12 is a block diagram of a test board included in a semiconductor device test system according to exemplary embodiments.

FIG. 12 is a block diagram of a test board 1000 included in a semiconductor device test system according to exemplary embodiments.

Referring to FIG. 12, the test board 1000 may include a structure in which a current mirror 300 and a DUT 200 are mounted together on a substrate.

The test board 1000 may include a first pad 1010, a second pad 1020, a third pad 1030, and a fourth pad 1040. The first pad 1010 may be connected to a power input terminal 210 of the DUT 200. The power input terminal 210 of the DUT 200 may be electrically connected to a power output terminal 110 of ATE 100 through the first pad 1010.

The second pad 1020 may be connected to a data input/output terminal 220 of the DUT 200. The data input/output terminal 220 of the DUT 200 may be electrically connected to a data input/output terminal 120 of the ATE 100 through the second pad 1020.

The third pad 1030 may be connected to an output terminal 230 of the DUT 200. The ATE 100 may be connected to the output terminal 230 of the DUT 200 through the third pad 1030 to measure an output voltage of the DUT 100.

The fourth pad 1040 may be connected to the current mirror 300, and a reference current provided by the ATE 100 may be input to the test board 1000 through the fourth pad 1040 and then supplied to the current mirror 300.

For example, when the DUT 200 is a semiconductor die obtained by dicing a semiconductor wafer having semiconductor circuits, the test board 1000 may be a probe card used to test the semiconductor die. The first through fourth pads 1010, 1020, 1030 and 1040 of the test board 1000 may be in the form of needles.

Figure 13:
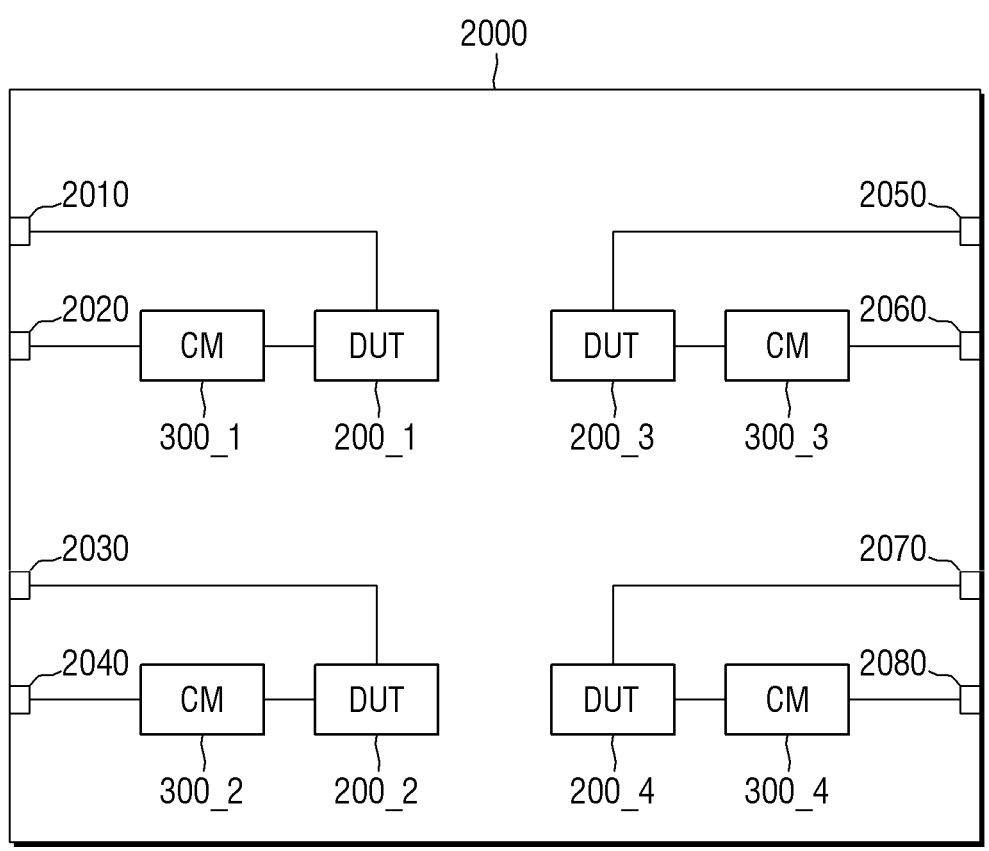
FIG. 13 is a block diagram of a test board included in a semiconductor device test system according to exemplary embodiments.

FIG. 13 is a block diagram of a test board 2000 included in a semiconductor device test system according to exemplary embodiments.

Referring to FIG. 13, a plurality of DUTs 200_1 through 200_4 and a plurality of current mirrors 300_1 through 300_4 may be mounted on the test board 2000. The test board 2000 may include a plurality of pads 2010 through 2080, and the pads 2010 through 2080 may be connected to the DUTs 200_1 through 200_4 and the current mirrors 300_1 through 300_4, respectively, as illustrated in FIG. 13.

Figure 14:
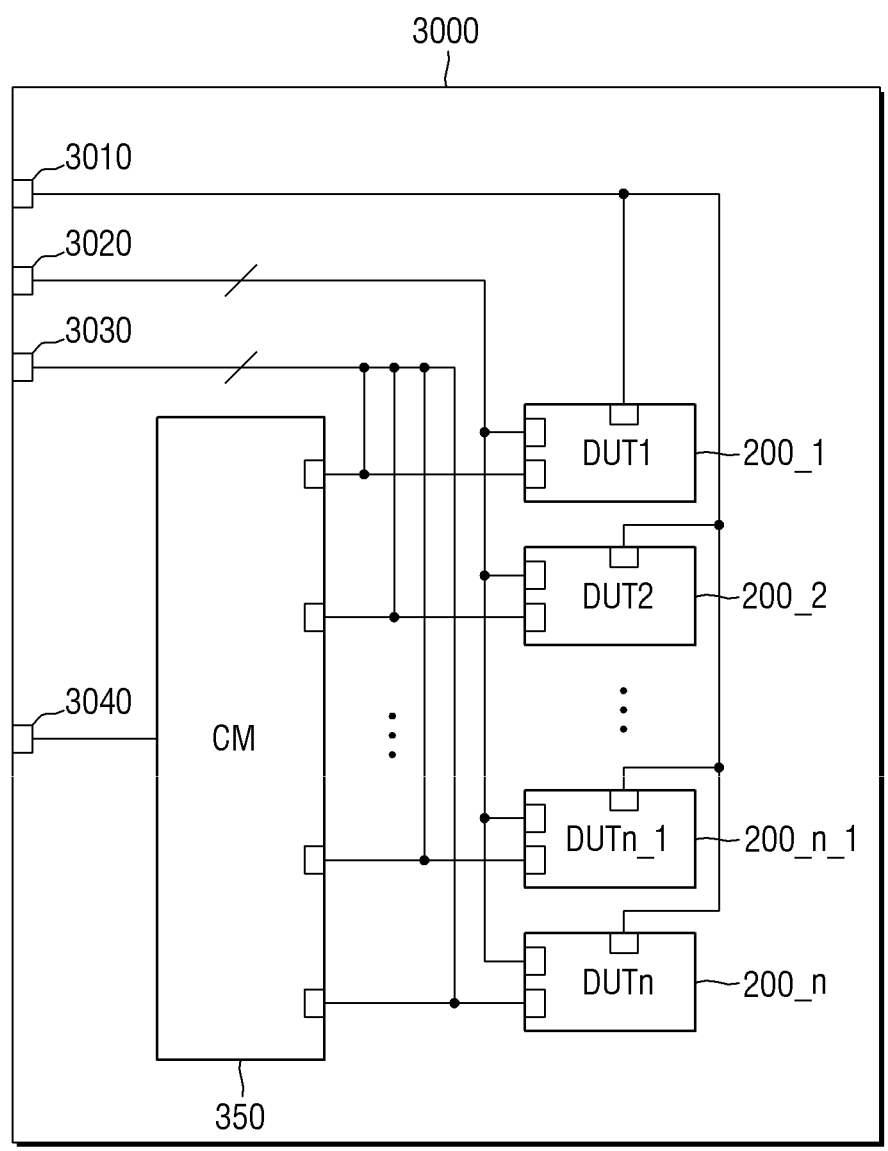
FIG. 14 is a block diagram of a test board included in a semiconductor device test system according to exemplary embodiments.

FIG. 14 is a block diagram of a test board 3000 included in a semiconductor device test system according to exemplary embodiments.

Referring to FIG. 14, the test board 3000 may include n DUTs 200_1 through 200_n electrically connected to one current mirror 350. That is, the test board 3000 illustrated in FIG. 14 may be a board on which the current mirror 350 and the DUTs 200_1 through 200_n of the semiconductor device test system described above with reference to FIG. 11 are mounted.

Compared with the test board 2000 illustrated in FIG. 13, the test board 3000 may include one current mirror 350 connected to the DUTs 200_1 through 200_n. Since one current mirror 350 is mounted on the test board 3000, only one pad 3040 is required to provide a reference current IREF to the test board 3000. That is, while the test board 2000 on which 4 DUTs and 4 current mirrors are mounted includes 4 pads for receiving a reference current (i.e., corresponding to a case in which n=4 in the exemplary embodiment of FIG. 14), the test board 3000 of FIG. 14 may receive the reference current IREF through one pad 3040.

The test board 3000 may include a first pad 3010 for providing power to the DUTs 200_1 through 200_n and a second pad 3020 for providing a control signal to the DUTs 200_1 through 200_n. The test board 3000 may include third pads 3030 for measuring output voltages of the DUTs 200_1 through 200_n.

Figure 15:
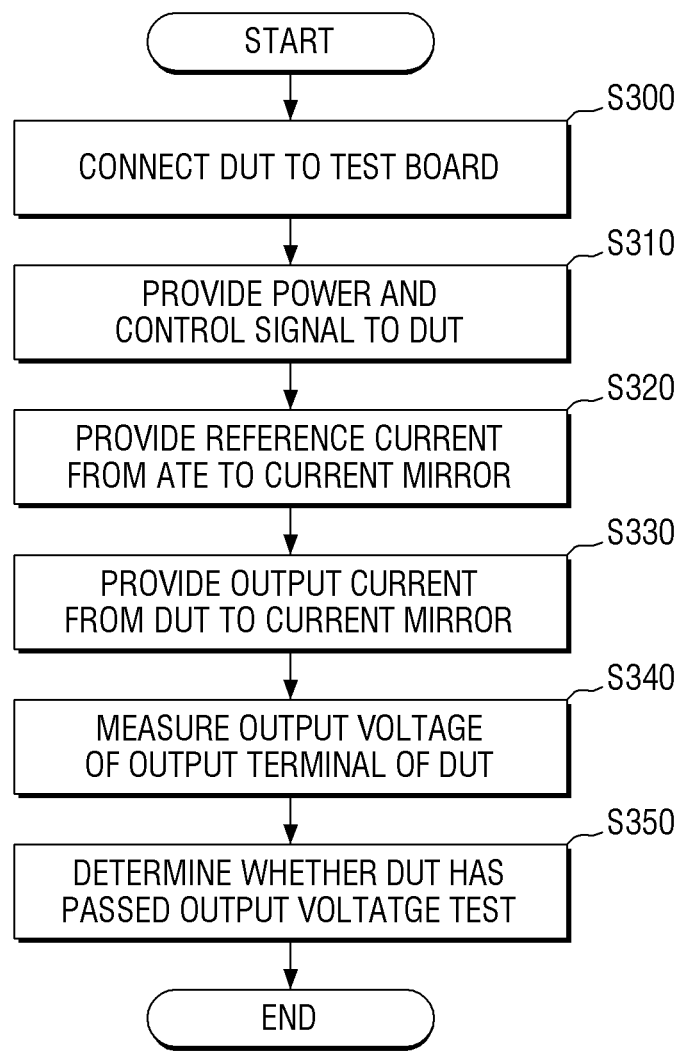
FIG. 15 is a flowchart illustrating a semiconductor device manufacturing method performed using a semiconductor device test system according to exemplary embodiments.

FIG. 15 is a flowchart illustrating a semiconductor device manufacturing method performed using a semiconductor device test system according to exemplary embodiments.

Referring to FIG. 15, the semiconductor device manufacturing method according to the exemplary embodiments may include connecting a DUT to a test board (operation S300), providing power and a control signal from ATE to the DUT (operation S310), providing a reference current from the ATE to a current mirror (operation S320), providing an output current from the DUT to the current mirror (operation S330), measuring an output voltage of an output terminal of the DUT (operation S340), and determining whether the DUT has passed or failed the output voltage test (operation S350).

The DUT may be, for example, a semiconductor device which has circuit elements formed through a semiconductor device manufacturing process and has been packaged through a packaging process. Connecting the DUT to the test board may be to mount the DUT on the test board. When the DUT is a packaged semiconductor device, it may be mounted on a socket of the test board so that it may be connected to the test board.

Operations S310 through S340 are the same as the corresponding operations of the semiconductor device test method described above with reference to FIG. 4, and thus a description thereof is omitted.

After measuring the output voltage of the DUT, the ATE may determine whether the DUT has passed the output voltage test (operation S350). When the DUT passes the output voltage test, the DUT may go through subsequent processes of the semiconductor device manufacturing method. For example, if the DUT is tested before being packaged after wafer dicing, the DUT, having passed, may go through a packaging process.

When the DUT fails the output voltage test, the subsequent processes may not be able to be performed on the DUT. Thus, the DUT may be discarded. The result of the output voltage test may be reflected in a DUT manufacturing process to conduct feedback such as changing the design of a DUT or modifying a recipe for manufacturing the semiconductor.

The exemplary embodiments of the present inventive concept have been described with reference to the attached drawings, but it may be understood by one of ordinary skill in the art that the present inventive concept may be performed one of ordinary skill in the art in other specific forms without changing the technical concept or essential features of the present inventive concept. Further, the above-described embodiments are merely examples and do not limit the scope of the rights of the present inventive concept.

What is claimed is:

1. A semiconductor device test system comprising:
a device under test (DUT) which provides an output voltage to a load connected to an output terminal;
automatic test equipment (ATE) which supplies power to the DUT and measures the output voltage of the DUT; and
a current mirror which is connected between the ATE and the DUT,
wherein the ATE outputs a reference current to the current mirror, and the DUT provides an output current to the current mirror, the output current being obtained by mirroring the reference current from the ATE.

2. The semiconductor device test system of claim 1, wherein a first magnitude of the reference current and a second magnitude of the output current are equal to each other.

3. The semiconductor device test system of claim 1, wherein the output current is a constant current.

4. The semiconductor device test system of claim 1, wherein the current mirror comprises a first transistor, a second transistor and a third transistor having respective gate terminals connected to each other, and the reference current provided to a drain terminal of the first transistor is mirrored to provide the output current to drain terminals of the second transistor and the third transistor.

5. The semiconductor device test system of claim 4, wherein the DUT comprises a first DUT which is electrically connected to the second transistor and a second DUT which is electrically connected to the third transistor, and the output current comprises a first output current which is obtained by mirroring the reference current and flows from the first DUT to the second transistor and a second output current which is obtained by mirroring the reference current and flows from the second DUT to the third transistor.

6. The semiconductor device test system of claim 5, wherein a first magnitude of the first output current and a second magnitude of the second output current are equal to each other.

7. The semiconductor device test system of claim 1, wherein the ATE provides a first reference current to the current mirror at a first time and provides a second reference current to the current mirror at a second time different from the first time.

8. The semiconductor device test system of claim 7, wherein the first reference current and the second reference current are different from each other.

9. The semiconductor device test system of claim 7, wherein the ATE measures a first output voltage of the DUT at the first time and a second output voltage of the DUT at the second time and compares the first output voltage and the second output voltage.

10. The semiconductor device test system of claim 9, wherein the ATE determines that the DUT has passed a test when the first output voltage and the second output voltage are the same.

11. The semiconductor device test system of claim 1, wherein the DUT is a power management integrated circuit (PMIC).

12. A semiconductor device test system comprising:
a substrate;
a current mirror which is mounted on the substrate to be electrically connected to an automatic test equipment (ATE) and receives a reference current from the ATE; and
a device under test (DUT) which is mounted on the substrate and configured to be electrically connected to the current mirror and provides an output current to the current mirror, the output current being obtained by mirroring the reference current from the ATE.

13. The semiconductor device test system of claim 12, wherein the output current is a constant current.

14. The semiconductor device test system of claim 12, wherein the current mirror comprises a first transistor, a second transistor and a third transistor having respective gate terminals connected to each other, and the reference current provided to a drain terminal of the first transistor is mirrored to provide the output current to drain terminals of the second transistor and the third transistor.

15. The semiconductor device test system of claim 14, wherein the DUT comprises a first DUT which is electrically connected to the second transistor and a second DUT which is electrically connected to the third transistor, and the output current comprises a first output current which is obtained by mirroring the reference current and flows from the first DUT to the second transistor and a second output current which is obtained by mirroring the reference current and flows from the second DUT to the third transistor.

16. A semiconductor device test system comprising:
a current mirror which comprises an input terminal and an output terminal; and
automatic test equipment (ATE) which provides a reference current to the current mirror and measures an output voltage of a DUT that outputs a current obtained by mirroring the reference current using the current mirror.

17. The semiconductor device test system of claim 16, wherein the ATE comprises a power output terminal which supplies power to the DUT and a data input/output terminal which provides a control signal to the DUT.

18. The semiconductor device test system of claim 16, wherein the ATE provides a first reference current to the current mirror at a first time and provides a second reference current different in magnitude from the first reference current to the current mirror at a second time different from the first time.

19. The semiconductor device test system of claim 18, wherein the ATE measures a first output voltage of the DUT at the first time and a second output voltage of the DUT at the second time and compares the first output voltage and the second output voltage.

20. The semiconductor device test system of claim 19, wherein the ATE determines that the DUT has passed a test when the first output voltage and the second output voltage are the same.

* * * * *